United States Patent [19]

Selwa

[11] Patent Number: 4,628,539
[45] Date of Patent: Dec. 9, 1986

[54] MUTING CIRCUIT

[75] Inventor: Anthony P. Selwa, Hendricks County, Ind.

[73] Assignee: RCA Corporation, Princeton, N.J.

[21] Appl. No.: 705,372

[22] Filed: Feb. 25, 1985

[51] Int. Cl.$^4$ .......................... H04B 1/10; H04B 1/16
[52] U.S. Cl. .................................. 455/194; 455/212; 455/221
[58] Field of Search ............... 455/154, 179, 194, 212, 455/221, 213; 381/104.94; 358/191.1

[56] References Cited

U.S. PATENT DOCUMENTS

| | | |
|---|---|---|
| 3,568,068 | 3/1971 | Russell, Jr. ............................ 455/212 |
| 3,602,822 | 8/1971 | Evans et al. . |
| 3,662,113 | 5/1972 | Von Recklinghausen ......... 455/212 |
| 3,882,400 | 5/1975 | Hamada . |
| 4,107,614 | 8/1978 | Sugai .................................... 455/212 |
| 4,112,371 | 9/1978 | Ogita .................................... 455/212 |
| 4,286,290 | 8/1981 | Pyles et al. . |
| 4,366,442 | 12/1982 | Yamada . |
| 4,450,586 | 5/1984 | Fujino .................................. 455/212 |
| 4,484,174 | 11/1984 | Wilber et al. . |

Primary Examiner—Jin F. Ng
Attorney, Agent, or Firm—Eugene M. Whitacre; Peter M. Emanuel; Adel A. Ahmed

[57] ABSTRACT

A television receiver has provisions for a second audio program (SAP) and an indication for signifying when the SAP is present and a muting circuit for muting the SAP, both in response to the output signal of a SAP detector. A filter capacitor is coupled to the detector output to prevent flicker of the indicator due to noise. To prevent the filter capacitor from incorrectly maintaining an indication of the presence of a SAP, thereby preventing proper SAP muting, when a new channel is selected, channel change signal causes a semiconductor switch to discharge the filter capacitor. A SAP defeat switch coupled to the SAP provided the SAP detector output is to defeat the SAP when stereo is being received. To prevent the filter capacitor from discharging to rapidly and thereby creating an audible transient when either the defeat switch or channel change switch is operated, a resistor is coupled between the SAP detector output and the common junction of the SAP defeat and channel change switches.

9 Claims, 1 Drawing Figure

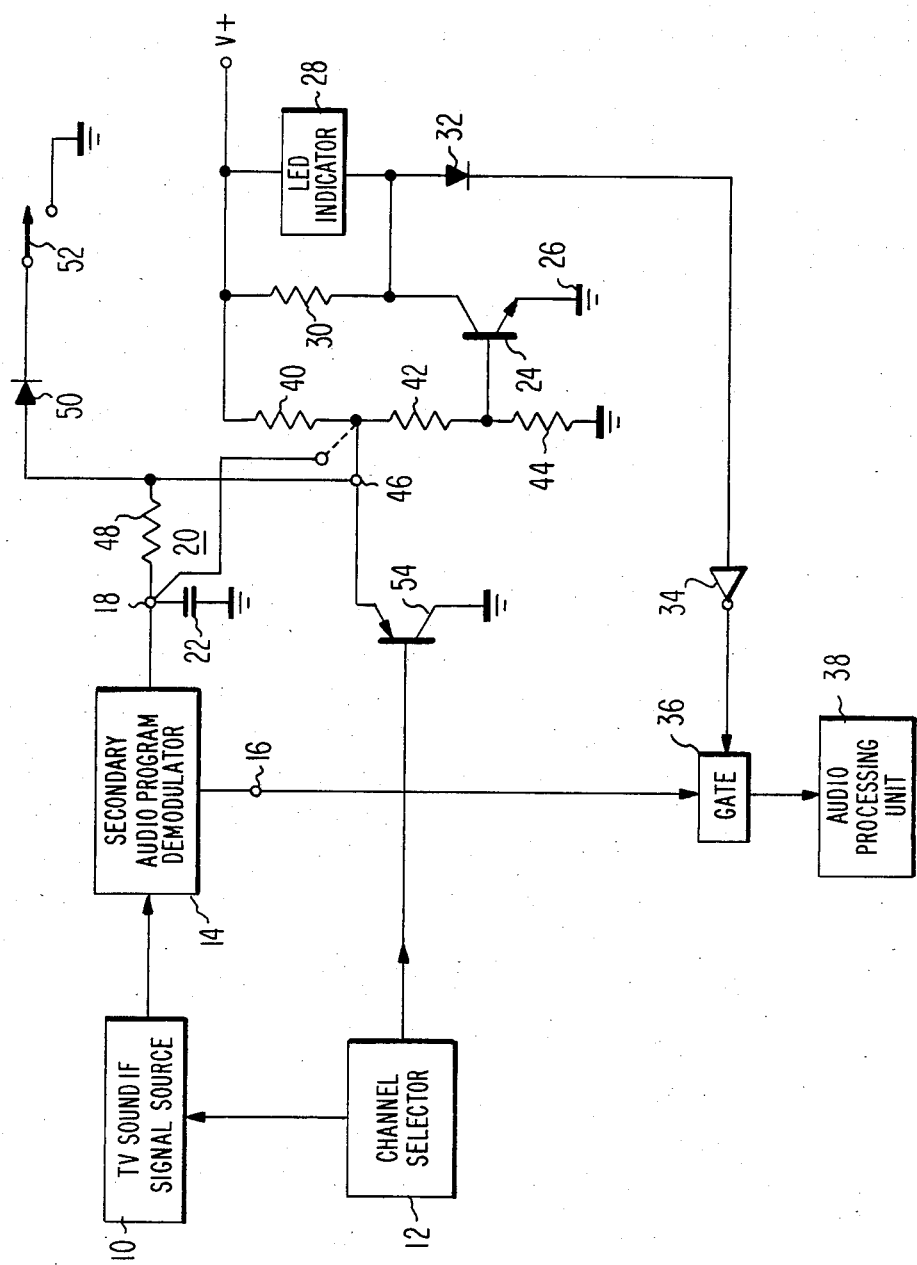

MUTING CIRCUIT

The present invention relates to the field of signal muting apparatus and, more particularly, to apparatus for selectively muting a signal in an audio channel.

Under certain conditions, the output of a signal processing circuit may contain components which are annoying to a user or which are otherwise undesirable. For example, when the input signal amplitude applied to a frequency modulated (FM) demodulator falls below a certain threshold for usable signals, the audio output signal will generally become very noisy and this may result in an annoying audible response. As a further example in a receiver having switched channels, such as a typical television (TV) receiver, an undesired audible transient is liable to occur in the audio output when the channel selector switch is operated.

Muting circuits for suppressing or squelching the audio output have been employed in the past to mute a receiver, for example, in the absence of a usable signal level or during operation of a channel selector switch. Examples of muting arrangements are provided in U.S. Pat. No. 3,602,822 issued in the name of Evans et al. and U.S. Pat. No. 4,366,422 issued in the name of Yamada.

Certain television transmissions include a secondary audio program (SAP) such as, for example, a translation into a second language, in addition to the primary audio or sound program. Typically, the SAP would be available from an intermediate frequency (IF) stage of a TV receiver in the form of an FM modulated signal, offset in frequency from the primary sound IF which, for example, is at 4.5 MHz in the United States. The FM modulated signal is typically demodulated by an SAP demodulator, such as a discriminator, which provides the SAP audio or other baseband signal. However, when the SAP is not provided on a particular channel to which the TV receiver is tuned, the corresponding FM modulated carrier will not be present, and in that case, the discriminator output would be a very noisy signal. To inhibit an annoying audible response in these circumstances, it is desirable to mute the audio output corresponding to the SAP. Typically, the demodulator also provides a logic signal output to indicate the presence or absence of an SAP signal. The logic signal may be used for operating a light emitting diode (LED) SAP indicator and an SAP gate for muting the demodulated output signal when no SAP signal is present. When the SAP signal level is absent or very weak, however, the noise present in the discriminator output tends to cause the SAP indicator to flicker and the SAP muting gate to be operated erratically and thus allow the noisy signal to pass. Both of these undesirable effects are avoided by providing a capacitor for low pass filtering of the logic signal output from the demodulator. A problem may arise, however, when a channel change occurs from a channel with an SAP signal to a channel without SAP. While the SAP signal is being received, the capacitor will be charged to the logic level corresponding to an SAP signal being present. When a channel change occurs to a channel without SAP, the logic signal output will change to the level which causes the SAP indicator to go out and the SAP muting gate to mute the audio output. However, this change will only occur after a certain time delay, since the capacitor charge will not change instantaneously. During this time, the noise in the discriminator output will not be muted and will tend to cause an objectionable audible response. For the reasons stated above, it is also desirable to mute the SAP during channel switching and to provide a switch to permit selective SAP muting.

A concurrently filed application Ser. No. 6/705,373 entitled "MUTING CIRCUIT", filed in the name of Anderson et al. and assigned to the Assignee of the present Application discloses an arrangement for muting the output of an SAP demodulator in a receiver including a channel selector. The demodulator provides a logic signal which is used for operating an SAP indicator light and for muting the SAP channel when a usable SAP signal is not present. In order to avoid the previously described problems of the SAP indicator light flickering and erratic muting caused by logic signal noise on a channel without SAP, the logic signal is first filtered by a low-pass filter including a filter capacitance. In the Application being referred to, muting during channel changing is accomplished by a control circuit to a level corresponding with the logic signal level for no SAP signal, which overcomes the previously described problem related to tuning from a channel with SAP to a channel without SAP. Discharging of the capacitance is performed at a controlled rate so as to prevent an audible disturbance which may occur if the capacitance is discharged too rapidly. The arrangement described in the Application being referred to also discloses a switch for selectively muting by discharging the filter capacitance. The switch may, for example, be ganged with a stereo/mono switch such that SAP response is muted unless the stereo mode is selected. However, if the switch is closed while an SAP signal is being received, the filter capacitance will be discharged rapidly and will be liable to cause a disturbance due to a transient which may occur.

In accordance with an aspect of the invention, an FM signal demodulator has a logic output for providing logic ouput signals of a first and second type for respectively indicating the presence or absence of an FM signal such as a SAP signal. A capacitive filter is coupled to the logic output for low-pass filtering the logic output signals. A signal gate having a control point coupled to the capacitive filter selectively couples the demodulated output signal to a load when a logic control signal at the control point is of the first type and does not couple the demodulated output signal to the load when the control signal is of the second type. First and second auxiliary muting switches, such as one for automatic muting are coupled to the control point during channel changes and are for manual muting when mono reproduction rather than SAP reproduction is selected, for selectively constraining the logic control signal at the control point to be of the second type. A resistance is coupled between the capacitive filter and the control point for inhibiting transients when either of the first and second auxiliary muting switches are operated.

In accordance with a further aspect of the invention, the control arrangement includes a current supply arrangement for varying the stored charge at a predetermined rate for setting to the second level.

These and other aspects of the invention will be explained with reference to the accompanying Drawing in which the sole FIGURE shows partly in block form and partly in circuit diagram form a schematic of a signal muting arrangement including a preferred embodiment of the present invention.

In the signal muting arrangement shown in the FIGURE, 10 is a source of TV sound IF signal, such as for example, a TV receiver, which may be switched to different channels by means of a channel selector switch 12. The IF signal supplied by source 10 is applied to a secondary audio program (SAP) demodulator 14. When the FM signal corresponding to the SAP is present, demodulator 14 supplies a demodulated SAP signal at a terminal 16 and a logic "1" or relatively positive output signal at a terminal 18. When no SAP signal is being received by demodulator 14, a logic "0" or ground potential output signal is provided at terminal 18. As will be explained below, this logic signal is used to control a SAP indicating light and a SAP muting gate. Typically, demodulator 14 may take the form of an analog or digital discriminator or a phase-locked-loop demodulator with a conventional arrangement for providing the logic output signal as well as a demodulated output signal. For example, demodulator 14 may comprise a Type CA 3215 integrated circuit, available from RCA Corporation. The logic output signal at terminal 18 is low-pass filtered by a capacitive filter arrangement 20 which comprises a capacitor 22 cooperating with the effective signal source impedance at terminal 18, which is provided by the output impedance of demodulator 14 and other impedances coupled to terminal 18. The purpose of capacitor 22 is to substantially prevent perturbations of the logic level produced at terminal 18 and corresponding flickering of the SAP indicating light and erratic operation of the SAP muting gate, which may tend to occur when no SAP signal is present.

An NPN transistor 24 is connected in common emitter configuration, the common potential to which its emitter is connected being ground 26. A circuit comprising an SAP LED indicator 28 and a pull-up resistor 30 is coupled between the collector of transistor 24 and a source of positive operating potential V+relative to ground potential. When transistor 24 is biased into conduction, its collector current flows through resistor 30 and SAP indicator 28, which will cause SAP indicator 28 to light up. Transistor 24 collector is further coupled by way of a diode 32 and an inverting buffer stage 34 to the control input of an SAP signal muting gate 36. The signal input of gate 36 is coupled to the demodulated output signal terminal 16 of demodulator 14 and the signal output of gate 36 is coupled to an audio processing unit 38, which may, for example, comprise a load such as an audio amplifier and a loudspeaker or a tape recording head. When the control potential at the control input of gate 36 is relatively positive, signals will be coupled from terminal 16 through gate 36 to audio processing unit 38. When the control potential is relatively negative or at ground potential, such signals are prevented from being coupled to audio processing unit 38 and the SAP response is muted.

Control and biasing potentials are applied to the base of transistor 24 by way of a network comprising resistors 40, 42 and 44 connected in series between the V+supply and ground, the base of transistor 24 being coupled to the junction of resistors 42 and 44. A control point 46 is coupled to the junction of resistors 40 and 42 and is further coupled to logic output terminal 18 by way of a resistor 48. Alternatively, the junction of resistors 40 and 42 may be coupled to terminal 18 instead of to control point 46. Control point 46 is also coupled by way of a diode 50 and a selectively operable SAP-disabling switch 52 to ground. Switch 52 may, for example, be ganged with a stereo/mono selector switch (not shown), such that SAP response is muted unless the stereo mode is selected. Control point 46 is further coupled to the emitter of a PNP transistor 54 which is in common collector or emitter follower configuration. The base of transistor 54 is coupled to the channel selector 12 such that ground potential is applied to the base while channel selector 12 is being operated to change channels. At times when channel selector 12 is not being operated, a relatively positive potential is applied to the base of transistor 54, so as to reverse bias its emitter base junction, so that it will have substantially no effect on the potential at control point 46.

For the purpose of explanation assume that an SAP signal is being demodulated, that switch 52 is open and that channel change switch 12 is not being operated. Accordingly, the logic output signal at terminal 18 will be relatively positive. This positive potential will be substantially communicated by way of resistor 48 to control point 46 and will be substantially unaffected by switch 52, which is open. As explained, the positive potential on control point 46 will not be affected by channel change switch 12 when it is not being operated. The positive potential at control point 46 will cause transistor 24 to be biased into conduction which, in turn will cause SAP indicator 28 to light up and gate 36 to couple the demodulated SAP signal from terminal 16 to audio processing unit 38.

Now assume that channel selector 12 is being operated to change channels. As explained, this will cause ground potential to be applied to the base of transistor 54. By emitter follower action, the potential at transistor 54 emitter and therefore also the potential at control point 46 will be caused to be clamped close to ground potential. This will cause transistor 24 to be non-conductive, which in turn will cause SAP indicator 28 not to light up and SAP gate 36 not to couple the SAP demodulated signal while channel change switch 12 is being operated. Furthermore, because capacitor 22 is coupled to the emitter of transistor 54 by way of resistor 48, capacitor 22 will be discharged at a predetermined and controlled rate by the current supplied through resistor 48 substantially to ground potential. The controlled discharge rate inhibits transients which might otherwise produce disturbing interference in the SAP audio response. Thus, each time channel change switch 12 is operated, capacitor 22 is substantially discharged, causing the potential at control point 46 to correspond to the muting condition.

The discharging of capacitor 22 to a low potential during muting solves another problem which may otherwise occur during channel selection. If capacitor 22 were not discharged and if a new channel were selected which did not provide an SAP signal after a channel which did provide an SAP signal, capacitor 22 would remain charged and muting would not take place until the charge had decayed sufficiently to cause the potential at control point 46 to fall below the level corresponding to the muting condition. Until this had occurred, noise produced by demodulator 14 on a channel without an SAP signal would be undesirably coupled to audio processing unit 38 and might produce disturbing interference in the SAP audio response.

In addition to inhibiting transients related to the channel selector muting function, resistor 48 also fulfills a similar function with regard to switch 52. As earlier noted, when mono operation is selected, switch 52 is closed. This will cause the signal at control point 46 to be substantially at ground potential, which is equivalent to the condition when no SAP signal is being received.

If switch 52 is closed while an SAP signal is being received, capacitor 22 will be discharged at a predetermined and controlled rate substantially to ground potential by way of resistor 48, diode 50 and switch 52. The controlled discharge rate inhibits transients which might otherwise produce disturbing interference in the SAP audio response.

The implementation of the invention in accordance with the FIGURE is illustrative. Various modifications to the circuitry for implementing the invention in accordance with the foregoing description will readily suggest themselves to one skilled in the art. For example, the choice of ground as a common reference potential and the illustrative polarity sense of the supply voltage may be modified to suit a particular application. In addition while the operation of the invention has been described with reference to a SAP audio baseband signal in a television receiver, the invention may also be used for muting of other kinds of signals. These and other modifications are contemplated to be within the scope of the present invention.

What is claimed is:

1. In a receiver including carrier selection means for tuning to a selected signal and further including an information signal demodulator coupled to said carrier selection means, having a baseband output for supplying a demodulated signal to load means and having a logic output for providing a logic output signal, said logic output signal being of a first type when said information signal is present and being of a second type when said information signal is absent, a signal processing arrangement comprising:

low-pass filter means coupled to said logic output for providing a low-pass filtered logic signal corresponding to said logic output signal, said low-pass filter means including filter capacitance means for storing charge, wherein first and second levels of stored charge correspond to said filtered logic signal being of said first and second types, respectively;
   resistance means having a first end coupled to said filter capacitance means and having a second end;
   first and second control means respectively coupled to said second end of said resistance means for respectively selectively setting said stored charge to said second level; and
   signal gate means having a control input coupled to one of said first and second ends of said resistance means, and being coupled between said baseband output and said load means for coupling said baseband signal to said load means when said filtered logic signal is of said first type and not coupling said baseband signal therebetween when said low-pass filtered logic signal is of said second type.

2. The arrangement recited in claim 1 wherein said control input of said signal gate means is coupled to said second end of said resistance means.

3. The arrangement recited in claim 2 wherein said first control means is coupled to said carrier selection means for setting said stored charge to said second level when said carrier selection means is being tuned from a previously selected signal to a newly selected signal.

4. The arrangement recited in claim 3 wherein said filter capacitance means comprises a shunt capacitance and said first and second control means respectively comprise potential clamp means for selectively and controllably discharging said shunt capacitance to said second level of charge.

5. The arrangement recited in claim 4 further including indicator means coupled to said low-pass filter means for indicating when said low-pass filtered logic signal is of a selected one of said first and second types.

6. In a receiver including carrier selection means for tuning to a selected signal and further including a frequency modulation (FM) demodulator coupled to said carrier selection means and having a demodulated output for supplying an audio signal to controllable audio signal processing means, said controllable audio signal processing means including inhibiting means with a control input for selectively inhibiting audio signal processing by said audio signal processing means, said demodulator further having a logic output for providing a logic output signal, said logic output signal being of a first type when the amplitude of said selected signal exceeds a first predetermined threshold amplitude and being of a second type when the amplitude of said selected signal is less than a second predetermined threshold amplitude, said second threshold amplitude being no greater than said first threshold amplitude, a signal processing arrangement comprising:

shunt capacitance means coupled to said logic output for filtering said logic output signal, said capacitance means exhibiting first and second states of stored charge respectively corresponding to said logic signal being of said first and second types;
   resistance means coupled between said control input of said inhibiting means and said capacitance means for causing said inhibiting means to respectively inhibit and not inhibit the audio processing of said audio signal processing means when said capacitance means exhibits said second and said first states of stored charge; and
   first and second control means, respectively coupled to said control input of said audio signal processing means for setting said stored charge to said second state when said carrier selection means is being tuned away from a previously selected signal to a newly selected signal.

7. In a receiver including carrier selection means for tuning to a selected signal and further including an information signal demodulator coupled to said carrier selection means and having a baseband output for supplying a demodulated signal to load means and having a logic output for providing a logic output signal, said logic output signal being of a first type when said information signal is present and being of a second type when said information signal is absent, a signal processing arrangement comprising:

capacitive filter means coupled to said logic output for low-pass filtering said logic signal;
   signal gate means having a control point and being coupled between said baseband output and said load means for selectively coupling said baseband signal to said load means when a logic control signal at said control point is of said first type and not coupling said baseband signal therebetween when said logic control signal is of said second type;
   first and second control means respectively coupled to said control point for respectively selectively setting said logic control signal at said control point to be of said second type; and
   resistance means coupled between said capacitive filter means and said control point for providing a resistive coupling between said capacitive filter and each of said first and second control means.

8. The arrangment recited in claim 7 wherein said first control means is coupled to said carrier selection means for automatically setting said logic control signal at said second level when said carrier selection means is being tuned away from a previously selected signal to a newly selected signal.

9. The arrangement recited in claim 8 wherein said receiver is a television receiver, said demodulator is an frequency modulation demodulator and said demodulated signal is a secondary audio program signal.

* * * * *